(12) United States Patent
Heo et al.

(10) Patent No.: US 11,824,118 B2
(45) Date of Patent: Nov. 21, 2023

(54) ELECTRONIC DEVICE AND METHOD OF MANUFACTURING THE SAME

(71) Applicant: Samsung Electronics Co., Ltd., Suwon-si (KR)

(72) Inventors: Jinseong Heo, Suwon-si (KR); Sangwook Kim, Suwon-si (KR); Yunseong Lee, Osan-si (KR); Sanghyun Jo, Seoul (KR); Hyangsook Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/060,140

(22) Filed: Nov. 30, 2022

(65) Prior Publication Data

US 2023/0116309 A1   Apr. 13, 2023

Related U.S. Application Data

(63) Continuation of application No. 17/001,979, filed on Aug. 25, 2020, now Pat. No. 11,522,082.

(30) Foreign Application Priority Data

Sep. 18, 2019   (KR) .................. 10-2019-0114968

(51) Int. Cl.
*H01L 29/78* (2006.01)
*H01L 29/40* (2006.01)
*H01L 29/51* (2006.01)

(52) U.S. Cl.
CPC ...... *H01L 29/78391* (2014.09); *H01L 29/401* (2013.01); *H01L 29/516* (2013.01)

(58) Field of Classification Search
CPC ............ H01L 29/78391; H01L 29/401; H01L 29/516; H01L 29/1054; H01L 29/24;
(Continued)

(56) References Cited

U.S. PATENT DOCUMENTS 7,820,506 B2   10/2010   Rocklein et al.
2006/0017120 A1   1/2006   Sakai
(Continued)

FOREIGN PATENT DOCUMENTS

KR   10-2008-0061524 A   7/2008

OTHER PUBLICATIONS

John Robertson, 'Band offsets of wide-band-gap oxides and implications for future electronic devices' *Journal of Vacuum Science & Technology B*, vol. 18, pp. 1785 (2000).
(Continued)

*Primary Examiner* — Sheikh Maruf
(74) *Attorney, Agent, or Firm* — Harness, Dickey & Pierce, P.L.C.

(57) ABSTRACT

Provided are an electronic device and a method of manufacturing the same. The electronic device includes a ferroelectric crystallization layer between a substrate and a gate electrode and a crystallization prevention layer between the substrate and the ferroelectric crystallization layer. The ferroelectric crystallization layer is at least partially crystallized and includes a dielectric material having ferroelectricity or anti-ferroelectricity. Also, the crystallization prevention layer prevents crystallization in the ferroelectric crystallization layer from being spread toward the substrate.

20 Claims, 11 Drawing Sheets

(58) Field of Classification Search
CPC ......... H01L 29/66969; H01L 21/28176; H01L 29/513; H01L 29/517; H01L 29/6684; H01L 51/0529; H01L 51/0541; H01L 21/02172; H01L 21/02271; H01L 21/02667; H01L 21/28194; H01L 29/40111
USPC ........................................................ 257/295
See application file for complete search history.

(56) References Cited

U.S. PATENT DOCUMENTS

| | | | |
|---|---|---|---|
| 2008/0105864 A1* | 5/2008 | Park | H01L 29/6684 257/E21.04 |
| 2008/0251816 A1* | 10/2008 | Tanaka | H01L 29/78391 257/295 |
| 2009/0261395 A1 | 10/2009 | Boescke | |
| 2009/0267122 A1 | 10/2009 | Ohmi et al. | |
| 2009/0302306 A1* | 12/2009 | Yun | H01L 29/0673 257/295 |
| 2010/0006954 A1 | 1/2010 | Huang et al. | |
| 2010/0243994 A1* | 9/2010 | Yoon | H01L 29/78391 257/295 |
| 2011/0048769 A1 | 3/2011 | Fujiwara | |
| 2011/0049592 A1* | 3/2011 | Yoon | H10B 51/30 257/295 |
| 2012/0292677 A1 | 11/2012 | Dubourdieu et al. | |
| 2014/0097474 A1* | 4/2014 | Saito | H10N 50/80 257/295 |
| 2015/0171183 A1* | 6/2015 | Sakai | H01L 21/28194 257/295 |
| 2015/0287834 A1* | 10/2015 | Liao | H01L 29/7848 257/295 |
| 2015/0340372 A1* | 11/2015 | Pandey | H10B 51/30 257/295 |
| 2015/0364566 A1 | 12/2015 | Liu et al. | |
| 2015/0380641 A1* | 12/2015 | Ino | H10N 70/8833 257/295 |
| 2016/0005749 A1* | 1/2016 | Li | H10B 41/30 257/295 |
| 2016/0064228 A1* | 3/2016 | van Bentum | H01L 29/516 257/295 |
| 2016/0111549 A1* | 4/2016 | Baars | H01L 21/823462 257/295 |
| 2017/0141235 A1 | 5/2017 | Lai et al. | |
| 2017/0345831 A1 | 11/2017 | Chavan et al. | |
| 2017/0365719 A1 | 12/2017 | Chen et al. | |
| 2018/0240804 A1 | 8/2018 | Yoo | |
| 2019/0131382 A1 | 5/2019 | Lu et al. | |
| 2019/0187087 A1 | 6/2019 | Cao et al. | |
| 2020/0105898 A1 | 4/2020 | Hsu et al. | |
| 2020/0357927 A1 | 11/2020 | Hsieh et al. | |
| 2020/0411662 A1 | 12/2020 | Lin et al. | |

OTHER PUBLICATIONS

Extended European Search Report dated Feb. 9, 2021, issued in corresponding European Patent Application No. 20194367.7.
Notice of Allowance dated Aug. 8, 2022, issued in corresponding U.S. Appl. No. 17/001,979.

* cited by examiner

< Annealing >

< Annealing >

< Annealing >

ELECTRONIC DEVICE AND METHOD OF MANUFACTURING THE SAME

CROSS-REFERENCE TO RELATED APPLICATION

This application is a continuation of U.S. application Ser. No. 17/001,979, filed Aug. 25, 2020, which claims the benefit of Korean Patent Application No. 10-2019-0114968, filed on Sep. 18, 2019, in the Korean Intellectual Property Office, the disclosure of each of which is incorporated herein in its entirety by reference.

BACKGROUND

1. Field

The present disclosure relates to an electronic device and a method of manufacturing the same.

2. Description of Related Art

Previous silicon-based electronic devices had limitations in terms of operational characteristics improvement and scaling down. For example, when operation voltage and current characteristics of a previous silicon-based logic transistor are measured, that sub-threshold swing (SS) may be limited to about 60 mV/dec. This may cause difficulties for decreasing an operation voltage to a value equal to or less than 0.8 V, as a size of the logic transistor is decreased. Also, as a result, power density may be increased. Accordingly, the logic transistor may have limitations for scaling down.

SUMMARY

Provided are electronic devices and methods of manufacturing the electronic devices.

Additional aspects will be set forth in part in the description which follows and, in part, will be apparent from the description, or may be learned by practice of the presented embodiments of the disclosure.

According to an aspect of an embodiment, an electronic device includes: a substrate; a gate electrode on the substrate; a ferroelectric crystallization layer between the gate electrode and the substrate, the ferroelectric crystallization layer being at least partially crystallized and including a dielectric material having ferroelectricity or anti-ferroelectricity; and a crystallization prevention layer between the ferroelectric crystallization layer and the substrate, the crystallization prevention layer including an amorphous dielectric material and being configured to prevent crystallization in the ferroelectric crystallization layer from spreading toward the substrate.

In some embodiments, the substrate may include a channel element at a location of the substrate corresponding to the gate electrode, and the substrate may include a source and a drain at both sides of the channel element.

In some embodiments, the channel element may include at least one of Si, Ge, SiGe, Groups III-V semiconductors, an oxide semiconductor, a nitride semiconductor, an oxynitride semiconductor, a two-dimensional (2D) semiconductor material, quantum dots, and an organic semiconductor.

In some embodiments, the ferroelectric crystallization layer may include a crystalline dielectric material having a dielectric constant that is greater than about 20. The ferroelectric crystallization layer may include an oxide including at least one of Si, Al, Hf, and Zr.

In some embodiments, the ferroelectric crystallization layer may further include a dopant.

In some embodiments, the crystallization prevention layer may have a dielectric constant that is greater than about 4 and may include a different dielectric material from a material of the ferroelectric crystallization layer.

In some embodiments, the crystallization prevention layer may include at least one of $AlO_x$ ($0<x<1$), $LaO_x$ ($0<x<1$), $YO_x$ ($0<x<1$), $LaAlO_x$ ($0<x<1$), $TaO_x$ ($0<x<1$), $TiO_x$ ($0<x<1$), $SrTiO_x$ ($0<x<1$), CaO, MgO, ZrSiO, and a 2D dielectric material.

In some embodiments, the electronic device may further include a high dielectric layer between the crystallization prevention layer and the substrate. The high dielectric layer may have a higher dielectric constant than silicon oxide and may include a different dielectric material from a material of the crystallization prevention layer.

In some embodiments, the high dielectric layer may include an amorphous dielectric material or a crystalline dielectric material.

In some embodiments, the electronic device may further include a high band gap layer between the high dielectric layer and the substrate. The high band gap layer may include an amorphous dielectric material having a greater band gap than a material of the high dielectric layer.

According to an aspect of another embodiment, a method of manufacturing an electronic device includes: preparing a substrate on which a channel element is provided; forming, on the substrate, a crystallization prevention layer including an amorphous dielectric material; forming an amorphous dielectric material layer on the crystallization prevention layer; forming a gate electrode on the amorphous dielectric material layer; and forming a ferroelectric crystallization layer having ferroelectricity or anti-ferroelectricity by crystallizing at least a portion of the amorphous dielectric material layer through an annealing process. The crystallization prevention layer may be configured to limit and/or prevent crystallization in the ferroelectric crystallization layer from being spread toward the substrate.

In some embodiments, the amorphous dielectric material layer may include a different amorphous dielectric material than a material of the crystallization prevention layer.

In some embodiments, the ferroelectric crystallization layer may include a crystalline dielectric material having a dielectric constant that is greater than about 20.

In some embodiments, the crystallization prevention layer may include a dielectric material having a dielectric constant that is greater than about 4.

In some embodiments, the crystallization prevention layer and the ferroelectric crystallization layer may be formed by using chemical vapor deposition (CVD) or an atomic layer deposition (ALD).

In some embodiments, the method may further include forming a high dielectric layer between the crystallization prevention layer and the substrate. The high dielectric layer may have a greater dielectric constant than silicon oxide and may include a different dielectric material than a material of the crystallization prevention layer.

In some embodiments, the high dielectric layer may include an amorphous dielectric material or a crystalline dielectric material.

In some embodiments, the method may further include forming a high band gap layer between the high dielectric layer and the substrate. The high band gap layer may include an amorphous dielectric material having a greater band gap than a material of the high dielectric layer.

In some embodiments, the gate electrode may be formed by depositing a conductive metal by using CVD, ALD, or physical vapor deposition (PVD).

According to example embodiments, an electronic device includes a channel element including an intermediate region between a first side and a second side; a gate electrode on the intermediate region of the channel element; a ferroelectric crystallization layer between the gate electrode and the channel element; and a crystallization prevention layer between the ferroelectric crystallization layer and the channel element. The ferroelectric crystallization layer may be at least partially crystallized and may include a dielectric material having ferroelectricity or anti-ferroelectricity. The crystallization prevention layer may include an amorphous dielectric material and may be configured to limit and/or prevent crystallization in the ferroelectric crystallization layer from spreading toward the channel element.

In some embodiments, the crystallization prevention layer may include at least one of $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), CaO, MgO, ZrSiO, and a two-dimensional (2D) dielectric material. The ferroelectric crystallization layer may include $ZrO_2$, $HfO_2$, $La_2O_3$, $Ta_2O_5$, BaO, or $TiO_2$.

In some embodiments, the electronic device may further include a substrate. The channel element may be a portion of the substrate, and the substrate may be a semiconductor substrate.

In some embodiments, the electronic device may further include a substrate. The channel element may be a channel layer on the substrate. The channel layer may include at least one of an oxide semiconductor, a nitride semiconductor, an oxynitride semiconductor, quantum dots, and an organic semiconductor.

In some embodiments, the electronic device may further include a source connected to the first side of the channel element and a drain connected to the second side of the channel element.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
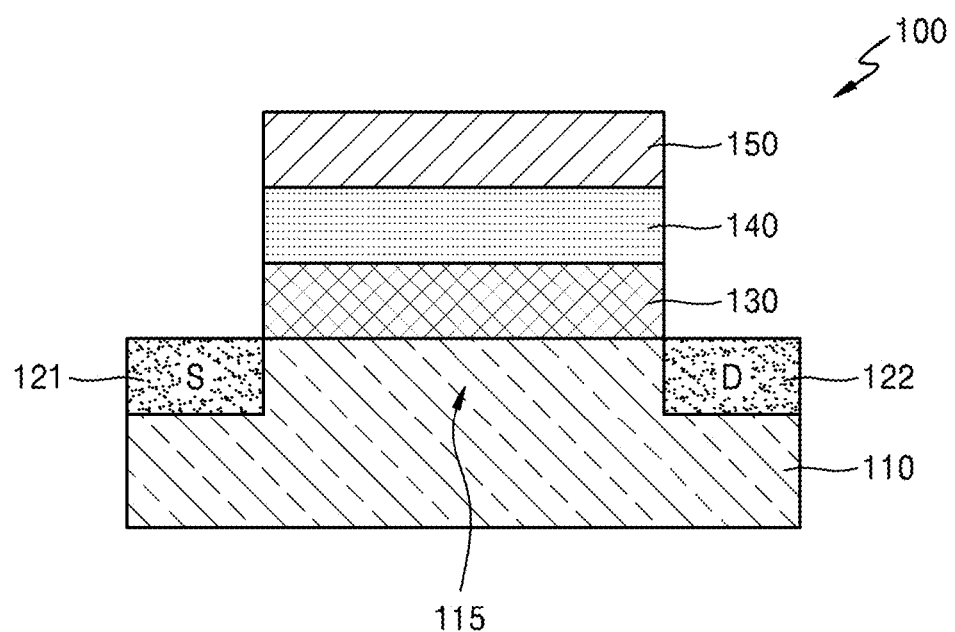
FIG. 1 is a cross-sectional view of an electronic device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items.

Expressions such as "at least one of," when preceding a list of elements (e.g., A, B, and C), modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; C; A and B; A and C; B and C; and A, B, and C."

Hereinafter, when an element is described as being "on" or "above" another element, the element may be directly on the other element or may be above the other element without contacting the other element. As used herein, the singular forms "a" and "an" are intended to include the plural forms as well, unless the context clearly indicates otherwise. It will be further understood that when a part "includes" or "comprises" an element, unless otherwise defined, the part may further include other elements, not excluding the other elements.

The term "the" and other equivalent determiners may correspond to a singular referent or a plural referent. Unless orders of operations included in a method are specifically described or there are contrary descriptions, the operations may be performed according to appropriate orders. It is not necessarily limited to the described orders of the operations. The use of all examples and example terms are merely for describing the disclosure in detail and the disclosure is not limited to the examples and the example terms, unless they are not defined in the scope of the claims.

Electronic devices described in embodiments described hereinafter may include semiconductor-based devices and may have a gate stack structure including a gate electrode and a high-k dielectric having a higher dielectric constant than silicon oxide. These electronic devices may include, for example, logic devices or memory devices.

FIG. 1 is a cross-sectional view of an electronic device according to an example embodiment.

Referring to FIG. 1, the electronic device 100 may include a substrate 110, and a crystallization prevention layer 130, a ferroelectric crystallization layer 140, and a gate electrode 150 sequentially stacked on the substrate 110. A channel element 115 may be provided on a location of the substrate 110, the location corresponding to the gate electrode 150, and a source S 121 and a drain D 122 may be provided at both sides of the channel element 115.

The source S 121 may be electrically connected to a side of the channel element 115, and the drain D 122 may be electrically connected to the other side of the channel element 115. The source S 121 and the drain D 122 may be formed by implanting impurities into different areas of the substrate 110, and an area of the substrate 110 between the source S 121 and the drain D 122 may be defined as the channel element 115.

The substrate 110 may include, for example, a Si substrate. However, the substrate 110 may also include a substrate including other semiconductor materials than Si, such as Ge, SiGe, Groups III-V semiconductors, etc. In this case, the channel element 115 may include Si, Ge, SiGe, or Groups III-V semiconductors. However, materials of the substrate 110 are not limited thereto and may vary. As described below, the channel element 115 may be formed as a material layer that is separate from the substrate 110, rather than being included in the substrate 110.

The crystallization prevention layer 130 and the ferroelectric crystallization layer 140 may be sequentially provided on an upper surface of the channel element 115 of the substrate 110. The ferroelectric crystallization layer 140 may have at least a portion that is crystallized, and the ferroelectric crystallization layer 140 may include a dielectric material having ferroelectricity or anti-ferroelectricity.

The ferroelectric crystallization layer 140 may be formed by crystallizing at least a portion of an amorphous dielectric material through an annealing process, as described below. The ferroelectric crystallization layer 140 formed by using this method may include a ferroelectric material or an anti-ferroelectric material. The ferroelectric crystallization layer 140 may have an effect of decreasing a sub-threshold swing SS of the electronic device 100 due to its ferroelectricity or anti-ferroelectricity.

The ferroelectric material may have non-centrosymmetric charge distribution in a unit cell in a crystallized material structure, and thus, may have a spontaneous dipole (electric dipole), that is, spontaneous polarization. The ferroelectric material may have remnant polarization due to the dipole, even when there is no external electric field. Also, a direction of polarization may be switched in each domain due to the external electric field.

The anti-ferroelectric material may include an array of electric dipoles. However, remnant polarization of the anti-ferroelectric material may be 0 or close to 0. Directions of adjacent dipoles become the opposite in a state when there is no electric field, so as to offset polarization, and thus, overall spontaneous polarization and remnant polarization may be 0 or close to 0. However, when an external electric field is applied, the anti-ferroelectric material may have polarization characteristics and switching characteristics.

The ferroelectric crystallization layer 140 may include a crystalline dielectric material having a dielectric constant that is, for example, greater than about 20. However, it is not limited thereto. For example, the ferroelectric crystallization layer 140 may include oxide including at least one of Si, Al, Hf, and Zr. As a detailed example, the ferroelectric crystallization layer 140 may include at least one of Hf-based oxide and Zr-based oxide. Here, the Hf-based oxide may include, for example, HfO or HfZrO and the Zr-based oxide may include, for example, ZrO.

Figure 2:
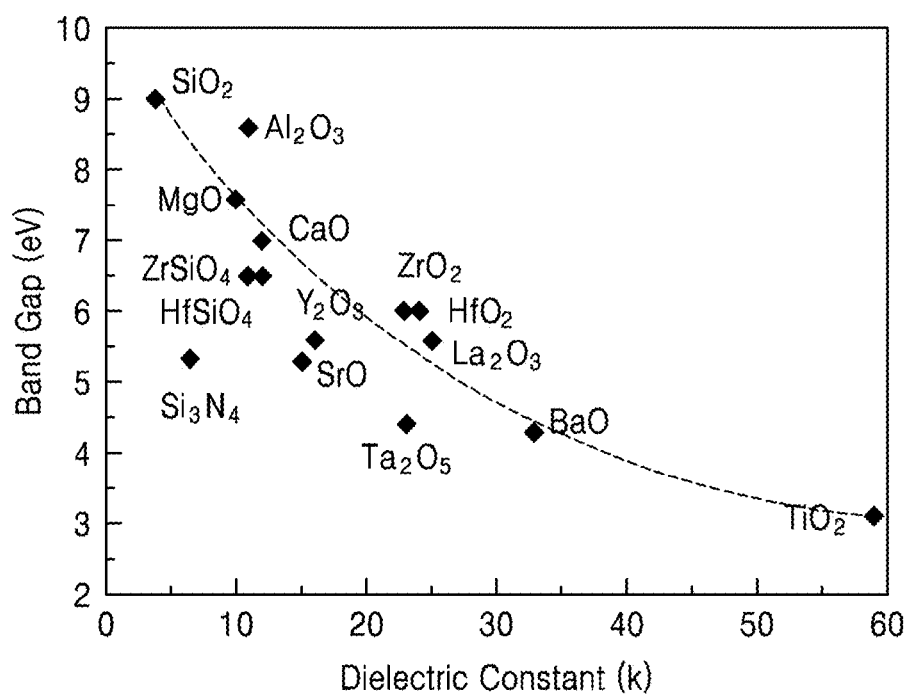
FIG. 2 is a graph showing examples of dielectric constants and band gaps of high-k dielectric materials.

FIG. 2 shows examples of dielectric constants (in detail, static dielectric constants) and band gaps of high-k dielectric materials. Here, the high-k dielectric materials denote materials having a higher dielectric constant than silicon oxide. Referring to FIG. 2, the ferroelectric crystallization layer 140 may include, for example, $ZrO_2$, $HfO_2$, $La_2O_3$, $Ta_2O_5$, BaO, or $TiO_2$. However, it is an example, and the ferroelectric crystallization layer 140 may include other various high-k dielectric materials than the described materials.

The ferroelectric crystallization layer 140 may further include a dopant, according to necessity. The dopant may include, for example, at least one of Si, Al, Zr, Y, La, Gd, Sr, and Hf, but is not limited thereto. When the ferroelectric crystallization layer 140 includes a dopant, the dopant may be doped throughout the ferroelectric crystallization layer 140 in a uniform concentration or may be doped in different concentrations according to areas of the ferroelectric crystallization layer 140. Also, different types of dopants may be doped according to areas of the ferroelectric crystallization layer 140.

The crystallization prevention layer 130 may be provided between the ferroelectric crystallization layer 140 and the channel element 115. The crystallization prevention layer 130 may limit and/or prevent crystallization in the ferroelectric crystallization layer 140 based on the annealing process from being spread toward the channel element 115.

The crystallization prevention layer 130 may include a different high-k dielectric material from the ferroelectric crystallization layer 140. For example, the crystallization prevention layer 130 may include a dielectric material having a higher dielectric constant than silicon oxide. In detail, the crystallization prevention layer 130 may include a dielectric material having a dielectric constant greater than about 4.

As a detailed example, the crystallization prevention layer 130 may include at least one of $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), CaO, MgO, ZrSiO, and a two-dimensional (2D) dielectric material. Here, the 2D dielectric material may be a 2D material having a dielectric property. For example, the 2D dielectric material may include hexagonal boron nitride (h-BN), etc. The materials described above are only examples, and the crystallization prevention layer 130 may include other various dielectric materials.

As described below, the ferroelectric crystallization layer 140 may be formed by crystallizing at least a portion of an amorphous dielectric material via an annealing process. The ferroelectric crystallization layer 140 formed through this crystallization process may include a polycrystalline dielectric material.

When the crystallization prevention layer 130 is not provided below the ferroelectric crystallization layer 140, a bonding orbital, which is formed in the ferroelectric crystallization layer 140 as the ferroelectric crystallization layer 140 is crystallized through the annealing process, may be spread toward the channel element 115 of the substrate 110. When the bonding orbital of the ferroelectric crystallization layer 140 is spread toward the channel element 115, current leakage may occur due to a grain boundary formed in a polycrystalline dielectric material of the ferroelectric crystallization layer 140, and the current leakage may deteriorate the performance of the electronic device 100.

According to the present embodiment, the crystallization prevention layer 130 is provided between the ferroelectric crystallization layer 140 and the channel element 115 of the substrate 110, and thus, the effects of the crystallization of the ferroelectric crystallization layer 140 may not be spread to an area below the crystallization prevention layer 130. In detail, when the ferroelectric crystallization layer 140 is crystallized through the annealing process, the bonding orbital may be formed in the ferroelectric crystallization layer 140. Here, the crystallization prevention layer 130 may limit and/or prevent the bonding orbital from being spread to the channel element 115 below the crystallization prevention layer 130.

The gate electrode 150 may be provided on an upper surface of the ferroelectric crystallization layer 140. Here, the gate electrode 150 may be arranged to face the channel element 115 of the substrate 110. The gate electrode 150 may include conductive metal.

The electronic device 100 described above according to the present embodiment described above may include the ferroelectric crystallization layer 140 having ferroelectricity or anti-ferroelectricity, and thus, a sub-threshold swing SS of the electronic device 100 may be decreased.

Figure 3:
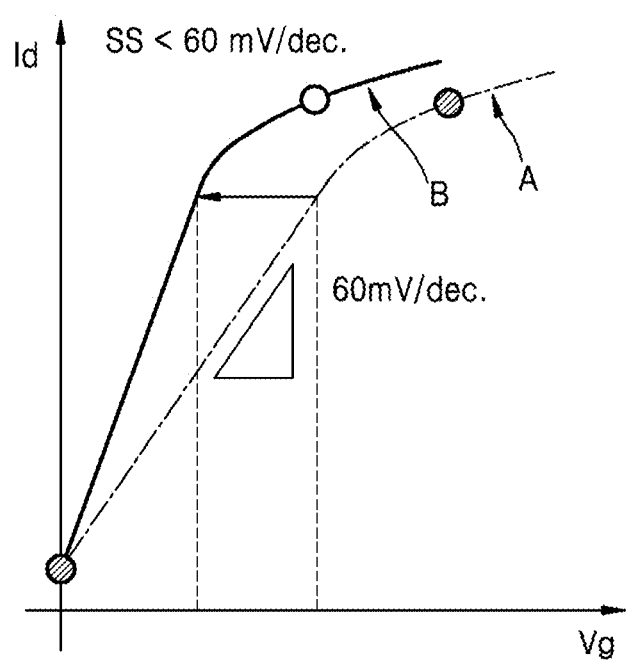
FIG. 3 is a graph for describing an effect of improving sub-threshold swing characteristics of an electronic device, according to an example embodiment.

FIG. 3 is a graph for describing an effect of improving sub-threshold swing characteristics of a logic transistor, according to an example embodiment. Here, a ferroelectric crystallization layer including ferroelectrics has been used in the logic transistor according to an example embodiment. In FIG. 3, A indicates characteristics of an operation voltage Vg and a current Id of a previous silicon-based logic transistor and B indicates characteristics of an operation voltage Vg and a current Id of the logic transistor according to an example embodiment.

Referring to FIG. 3, in the case of the previous silicon-based transistor, the sub-threshold swing SS may be limited to about 60 mV/dec. However, in the case of the logic transistor according to an example embodiment, the sub-threshold swing SS may be decreased to a value equal to or less than 60 mV/dec, based on voltage amplification occurring when a domain in the ferroelectrics is switched.

In the electronic device 100 according to an embodiment, the crystallization prevention layer 130 may be provided between the ferroelectric crystallization layer 140 and the channel element 115; thus, crystallization of the ferroelectric crystallization layer 140 via an annealing process may be limited and/or prevented from being spread toward the channel element 115, so as to prevent current leakage of the electronic device 100. Like this, since the crystallization prevention layer 130 prevents the crystallization in the ferroelectric crystallization layer 140 from affecting an area below the crystallization prevention layer 130, the ferroelectric crystallization layer 140 may maintain the effect of ferroelectricity or anti-ferroelectricity based on the crystallization, while current leakage is limited and/or prevented. Accordingly, the performance of the electronic device 100 may be improved.

Figure 4:
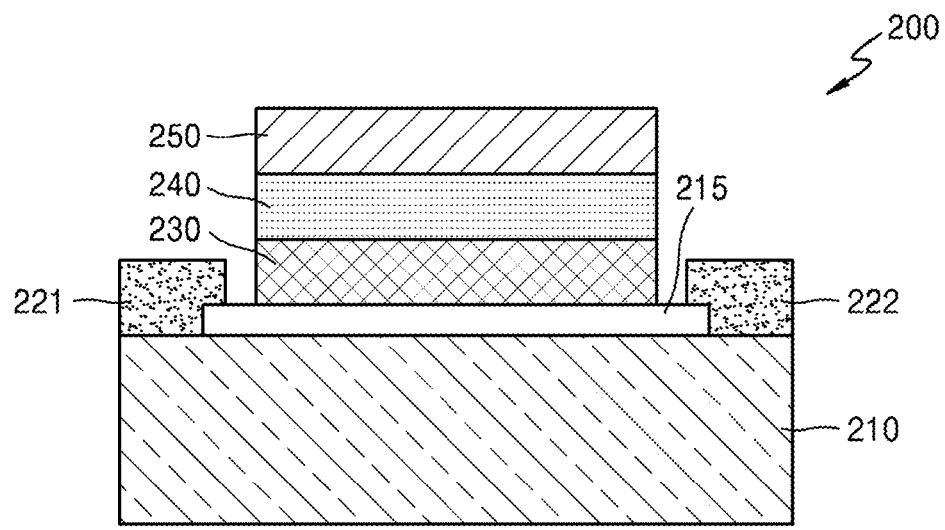
FIG. 4 is a cross-sectional view of an electronic device according to another example embodiment.

FIG. 4 is a cross-sectional view of an electronic device 200 according to another example embodiment. Hereinafter, different aspects from the aspects of the embodiment described above will be mainly described.

Referring to FIG. 4, the electronic device 200 may include a substrate 210, and a channel layer 215, a crystallization prevention layer 230, a ferroelectric crystallization layer 240, and a gate electrode 250 sequentially stacked on the substrate 210. A source electrode 221 and a drain electrode 222 may be provided at both sides of the channel layer 215.

The substrate 210 may include, for example, Si, Ge, SiGe, Groups III-V semiconductors, etc., but is not limited thereto. The channel layer 215 may be provided on an upper surface of the substrate 210. The channel layer 215 may be formed as a material layer that is separate from the substrate 210, rather than being included in the substrate 210. The channel layer 215 may include, for example, at least one of an oxide semiconductor, a nitride semiconductor, an oxynitride semiconductor, a 2D semiconductor material, quantum dots, and an organic semiconductor. Here, the oxide semiconductor may include, for example, InGaZnO, etc., the 2D semiconductor material may include transition metal dichalcogenide (TMD) or graphene, and the quantum dots may include colloidal QD, a nanocrystal structure, etc. However, it is only an example, and the present embodiment is not limited thereto.

The source electrode 221 and the drain electrode 222 may be provided at both sides of the channel layer 215. The source electrode 221 may be connected to a side of the channel layer 215, and the drain electrode 222 may be connected to the other side of the channel layer 215. The source electrode 221 and the drain electrode 222 may include a conductive material, such as a metal, a metal compound, a conductive polymer, etc.

The crystallization prevention layer 230, the ferroelectric crystallization layer 240, and the gate electrode 250 sequentially stacked on the channel layer 225 are described above, and thus, their detailed descriptions will be omitted.

Figure 5:
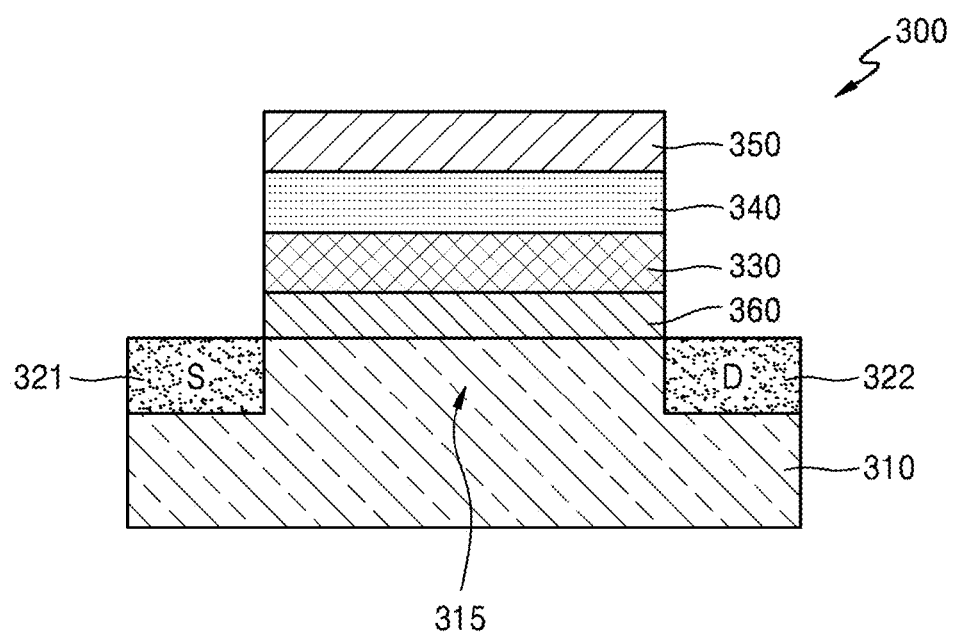
FIG. 5 is a cross-sectional view of an electronic device according to another example embodiment.

FIG. 5 is a cross-sectional view of an electronic device 300 according to another example embodiment.

Referring to FIG. 5, the electronic device 300 may include a substrate 310, and a high dielectric layer 360, a crystallization prevention layer 330, a ferroelectric crystallization layer 340, and a gate electrode 350 sequentially stacked on the substrate 310. A channel element 315 may be provided on a location of the substrate 310, the location corresponding to the gate electrode 350, and a source S 321 and a drain D 332 may be provided at both sides of the channel element 315.

The source S 321 may be electrically connected to a side of the channel element 315 and the drain D 322 may be electrically connected to the other side of the channel element 315. The source S 321 and the drain D 322 may be formed by implanting impurities into different areas of the substrate 310 and an area of the substrate 310 between the source S 321 and the drain D 322 may be defined as the channel element 315.

The substrate 310 may include, for example, Si, Ge, SiGe, Groups III-V semiconductors, etc. In this case, the channel element 315 may include Si, Ge, SiGe, or Groups III-V semiconductors. However, materials of the substrate 310 are not limited thereto and may vary. The channel element 315 may be formed as a material layer that is separate from the substrate 310, as illustrated in FIG. 4, rather than being included in the substrate 310.

The high dielectric layer 360, the crystallization prevention layer 330, and the ferroelectric crystallization layer 340 may be sequentially provided on an upper surface of the channel element 315 of the substrate 310.

As described above, at least a portion of the ferroelectric crystallization layer 340 may be crystallized and the ferroelectric crystallization layer 340 may include a dielectric material having ferroelectricity or anti-ferroelectricity. The ferroelectric crystallization layer 340 may include a crystalline dielectric material having a dielectric constant that is, for example, greater than about 20. However, it is not limited thereto. For example, the ferroelectric crystallization layer 340 may include oxide including at least one of Si, Al, Hf, and Zr. As a detailed example, the ferroelectric crystallization layer 340 may include at least one of Hf-based oxide and Zr-based oxide. Here, the Hf-based oxide may include, for example, HfO or HfZrO and the Zr-based oxide may include, for example, ZrO.

The ferroelectric crystallization layer 340 may further include a dopant, according to necessity. The dopant may include, for example, at least one of Si, Al, Zr, Y, La, Gd, Sr, and Hf, but is not limited thereto.

The crystallization prevention layer 330 may be provided at a lower surface of the ferroelectric crystallization layer 340. As described above, the crystallization prevention layer 330 may limit and/or prevent crystallization in the ferroelectric crystallization layer 340 through an annealing process from being spread toward the channel element 315.

The crystallization prevention layer 330 may include a different high-k dielectric material from the ferroelectric crystallization layer 340. For example, the crystallization prevention layer 330 may include a dielectric material having a higher dielectric constant than silicon oxide. In detail, the crystallization prevention layer 330 may include a dielectric material having a dielectric constant greater than about 4.

As a detailed example, the crystallization prevention layer 330 may include at least one of $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), CaO, MgO, ZrSiO, and a 2D dielectric material. Here, the 2D dielectric material may be a 2D material having a dielectric property. For example, the 2D dielectric material may include hexagonal boron nitride (h-BN), etc. The materials described above are only examples, and the crystallization prevention layer 330 may include other various dielectric materials.

The high dielectric layer 360 may be provided at a lower surface of the crystallization prevention layer 330. The high dielectric layer 360 may, together with the crystallization prevention layer 330, control the crystallization of the ferroelectric crystallization layer 340. To this end, the high dielectric layer 360 may include a different dielectric material from the crystallization prevention layer 330. In detail, the high dielectric layer 360 may include a high-k dielectric material having a greater dielectric constant than silicon oxide.

The high dielectric layer 360 may include an amorphous dielectric material or a crystalline dielectric material. For example, the high dielectric layer 360 may include the same dielectric material as the ferroelectric crystallization layer 340. However, it is not limited thereto, and the high dielectric layer 360 may include a different high-k dielectric material from the ferroelectric crystallization layer 340.

The gate electrode 350 may be provided on an upper surface of the ferroelectric crystallization layer 340. Here, the gate electrode 350 may be arranged to face the channel element 315 of the substrate 310. The gate electrode 350 may include conductive metal.

In the electronic device 300 according to the present embodiment, the crystallization prevention layer 330 and the high dielectric layer 360 may be provided below the ferroelectric crystallization layer 340, and the crystallization prevention layer 330 and the high dielectric layer 360 may include different materials from each other. Thus, crystallization of the ferroelectric crystallization layer 340 may be effectively controlled. Accordingly, current leakage may be limited and/or prevented and the performance of the electronic device 300 may be improved.

While FIG. 5 illustrates the crystallization prevention layer 330 formed on the high k dielectric layer 360, inventive concepts are not limited thereto. In some embodiments, the crystallization prevention layer 330 may be formed between the substrate 310 and the high k dielectric layer 360 and the ferroelectric crystallization layer 340 may be formed on top of the high k dielectric layer 360.

Figure 6:
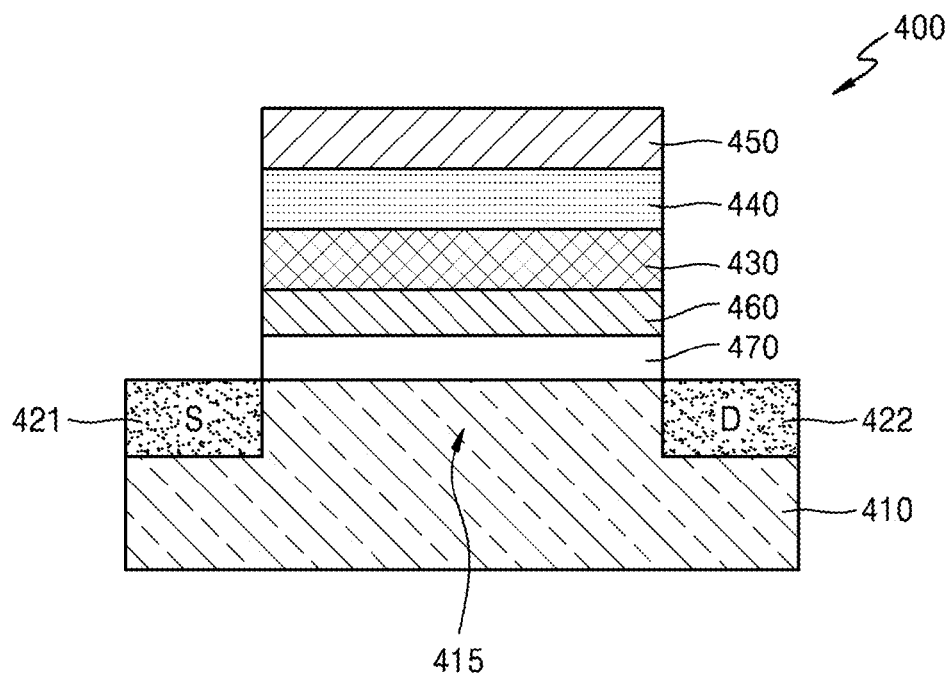
FIG. 6 is a cross-sectional view of an electronic device according to another example embodiment.

FIG. 6 is a cross-sectional view of an electronic device 400 according to another example embodiment.

Referring to FIG. 6, the electronic device 400 may include a substrate 410, and a high band gap layer 470, a high dielectric layer 460, a crystallization prevention layer 430, a ferroelectric crystallization layer 440, and a gate electrode 450 sequentially stacked on the substrate 410. A channel element 415 may be provided on a location of the substrate 410, the location corresponding to the gate electrode 450, and a source S 421 and a drain D 422 may be provided at both sides of the channel element 415.

The substrate 410 may include, for example, Si, Ge, SiGe, Groups III-V semiconductors, etc. In this case, the channel element 415 may include Si, Ge, SiGe, or Groups III-V semiconductors. However, materials of the substrate 410 are not limited thereto and may vary. The channel element 415 may be formed as a material layer that is separate from the substrate 410, as illustrated in FIG. 4, rather than being included in the substrate 410.

The high band gap layer 470, the high dielectric layer 460, the crystallization prevention layer 430, and the ferroelectric crystallization layer 440 may be sequentially provided on an upper surface of the channel element 115 of the substrate 410.

As described above, at least a portion of the ferroelectric crystallization layer 440 may be crystallized and the ferroelectric crystallization layer 440 may include a dielectric material having ferroelectricity or anti-ferroelectricity. The ferroelectric crystallization layer 440 may include a crystalline dielectric material having a dielectric constant that is, for example, greater than about 20. However, it is not limited thereto. For example, the ferroelectric crystallization layer 440 may include oxide including at least one of Si, Al, Hf, and Zr. The ferroelectric crystallization layer 440 may further include a dopant, according to necessity.

The crystallization prevention layer 430 may be provided at a lower surface of the ferroelectric crystallization layer 440. As described above, the crystallization prevention layer 430 may limit and/or prevent crystallization in the ferroelectric crystallization layer 440 through an annealing process from being spread toward the channel element 415.

The crystallization prevention layer 430 may include a different high-k dielectric material from the ferroelectric crystallization layer 440. For example, the crystallization prevention layer 430 may include a dielectric material having a higher dielectric constant than silicon oxide. In detail, the crystallization prevention layer 430 may include a dielectric material having a dielectric constant greater than about 4. For example, the crystallization prevention layer 430 may include at least one of $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), CaO, MgO, ZrSiO, and a 2D dielectric material.

The high dielectric layer 460 may be provided at a lower surface of the crystallization prevention layer 430. The high dielectric layer 460 may, together with the crystallization prevention layer 430, control the crystallization of the ferroelectric crystallization layer 440. To this end, the high dielectric layer 460 may include a different dielectric material from the crystallization prevention layer 430. In detail, the high dielectric layer 460 may include a high-k dielectric material having a greater dielectric constant than silicon oxide. The high dielectric layer 460 may include an amorphous dielectric material or a crystalline dielectric material.

The high band gap layer 470 may be provided between the high dielectric layer 460 and the channel element 415. The high band gap layer 470 may suppress or prevent current leakage and also may be used for capacitance matching in a gate stack structure. The high band gap layer 470 may include an amorphous dielectric material having a greater band gap than a material of the high dielectric layer 460 formed above the high band gap layer 470. For example, the high band gap layer 470 may include oxide including at least one of Si, Al, Hf, and Zr. However, it is not limited thereto.

The gate electrode 450 may be provided on an upper surface of the ferroelectric crystallization layer 440. Here, the gate electrode 450 may be arranged to face the channel element 415 of the substrate 410. The gate electrode 450 may include conductive metal.

The electronic device 400 according to the present embodiment may include the crystallization prevention layer 430 and the high dielectric layer 460 below the ferroelectric crystallization layer 440, and thus, may effectively control the crystallization of the ferroelectric crystallization layer 440. Also, the electronic device 400 may include, between the high dielectric layer 460 and the channel element 415, the high band gap layer 470 including the amorphous dielectric material having a greater band gap than the amorphous dielectric material of the high dielectric layer 460, and thus, may effectively limit and/or prevent current leakage of the electronic device 400.

While FIG. 6 illustrates the crystallization prevention layer 430 formed on the high k dielectric layer 460 and the high band gap layer 470, inventive concepts are not limited thereto. In some embodiments, the crystallization prevention layer 430, high k-dielectric layer 460, and high band gap layer 470 may be stacked in a different order.

FIGS. 7A through 7F are views for describing a method of manufacturing an electronic device, according to an example embodiment.

Figure 7A:
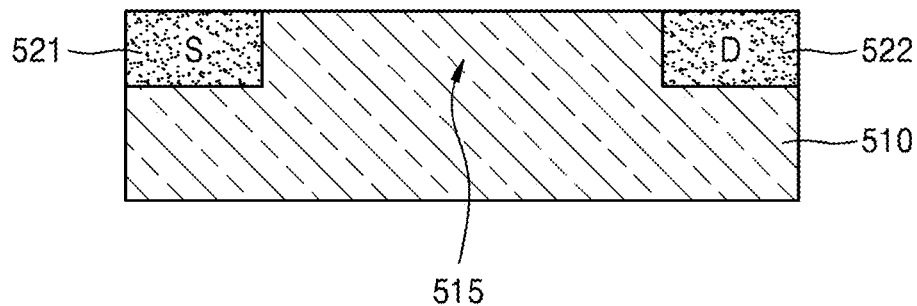
FIGS. 7A through 7F are views for describing a method of manufacturing an electronic device, according to an example embodiment.

Referring to FIG. 7A, a substrate 510, on which a channel element 515, a source S 521, and a drain D 522 are provided, may be prepared. The source S 521 and the drain D 522 may be formed by implanting and doping impurities in different areas of the substrate 510, and an area of the substrate 510 between the source S 521 and the drain D 522 may be defined as the channel element 515. The substrate 510 may include, for example, Si, Ge, SiGe, Groups III-V semiconductors, etc. In this case, like the substrate 510, the channel element 515 may include Si, Ge, SiGe, or Groups III-V semiconductors. Materials of the substrate 510 are not limited thereto and may vary. The source S 521 and the drain D 522 may formed at a different time point. For example, after forming a gate electrode 550 (see FIG. 7D) described below, the source S 521 and the drain D 522 may be formed in the substrate 510.

The channel element 515 may be formed on an upper surface of the substrate 510, as a material layer separate from the substrate 510, rather than being included in the substrate 510. In this case, materials of the channel element 515 may vary. For example, the channel element 515 may include at least one of an oxide semiconductor, a nitride semiconductor, an oxynitride semiconductor, a 2D semiconductor material, quantum dots, and an organic semiconductor. The oxide semiconductor may include, for example, InGaZnO, etc., the 2D semiconductor material may include TMD or graphene, and the quantum dots may include colloidal QDs, a nanocrystal structure, etc. However, it is only an example, and the present embodiment is not limited thereto.

Figure 7B:
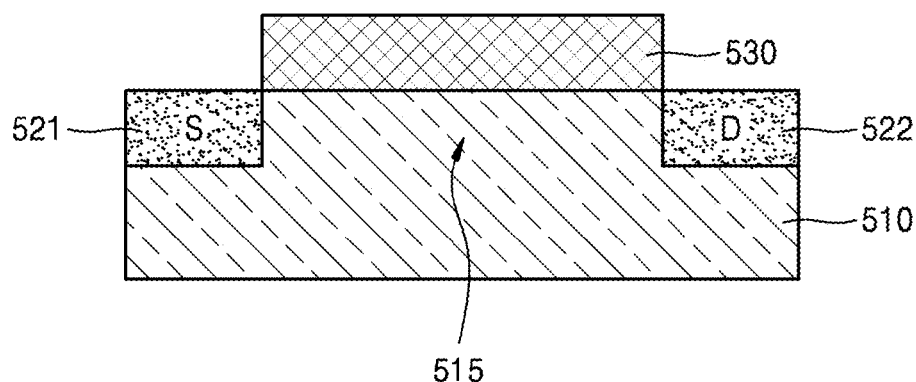

Referring to FIG. 7B, a crystallization prevention layer 530 may be formed on an upper surface of the channel element 515 of the substrate 510. The crystallization prevention layer 530 may be formed by depositing an amorphous dielectric material on the upper surface of the channel element 515 by using, for example, chemical vapor deposition (CVD) or atomic layer deposition (ALD).

The crystallization prevention layer 530 may limit and/or prevent the crystallization in a ferroelectric crystallization layer 540, which is formed by crystallizing an amorphous dielectric material layer 540' (see FIG. 7C) through an annealing process, from being spread toward the channel element 515.

The crystallization prevention layer 530 may include a high-k dielectric material. For example, the crystallization prevention layer 530 may include a dielectric material having a higher dielectric constant than silicon oxide. In detail, the crystallization prevention layer 530 may include a dielectric material having a dielectric constant greater than about 4.

As a detailed example, the crystallization prevention layer 530 may include at least one of $AlO_x$ (0<x<1), $LaO_x$ (0<x<1), $YO_x$ (0<x<1), $LaAlO_x$ (0<x<1), $TaO_x$ (0<x<1), $TiO_x$ (0<x<1), $SrTiO_x$ (0<x<1), CaO, MgO, ZrSiO, and a 2D dielectric material. Here, the 2D dielectric material may be a 2D material having a dielectric property. For example, the 2D dielectric material may include hexagonal boron nitride (h-BN), etc. The materials described above are only examples, and the crystallization prevention layer 530 may include other various dielectric materials.

Figure 7C:
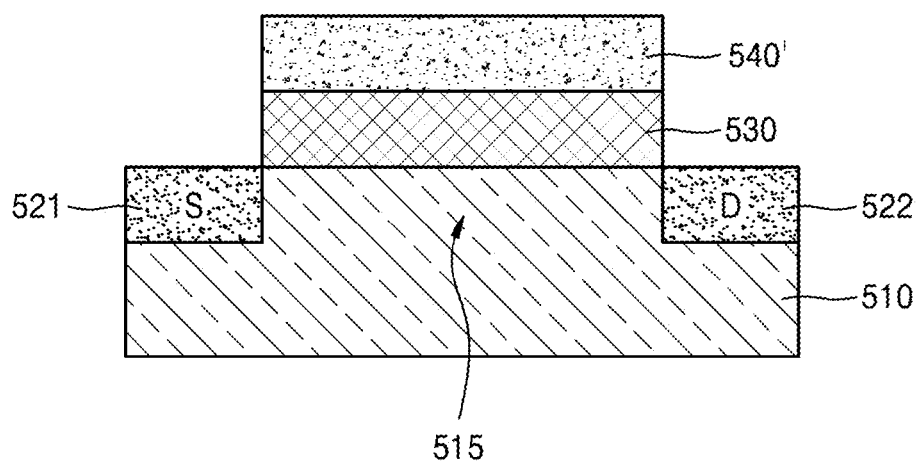

Referring to FIG. 7C, the amorphous dielectric material layer 540' may be formed on an upper surface of the crystallization prevention layer 530. The amorphous dielectric material layer 540' may be formed by depositing a dielectric material different from the dielectric material of the crystallization prevention layer 530 on the upper surface of the crystallization prevention layer 530, by using, for example, CVD or ALD.

The ferroelectric crystallization layer 540 may be formed by crystallizing at least a portion of the amorphous dielectric material layer 540' through an annealing process described below. The ferroelectric crystallization layer 540 formed by using this method may include a crystalline dielectric material having a dielectric constant that is, for example, greater than about 20, as described below. However, it is not limited thereto.

The amorphous dielectric material layer 540' may include, for example, oxide including at least one of Si, Al, Hf, and Zr. As a detailed example, the amorphous dielectric material layer 540' may include at least one of Hf-based oxide and Zr-based oxide. Here, the Hf-based oxide may include, for example, HfO or HfZrO and the Zr-based oxide may include, for example, ZrO. The amorphous dielectric material layer 540' may further include a dopant, according to necessity. The dopant may include, for example, at least one of Si, Al, Zr, Y, La, Gd, Sr, and Hf, but is not limited thereto.

Figure 7D:
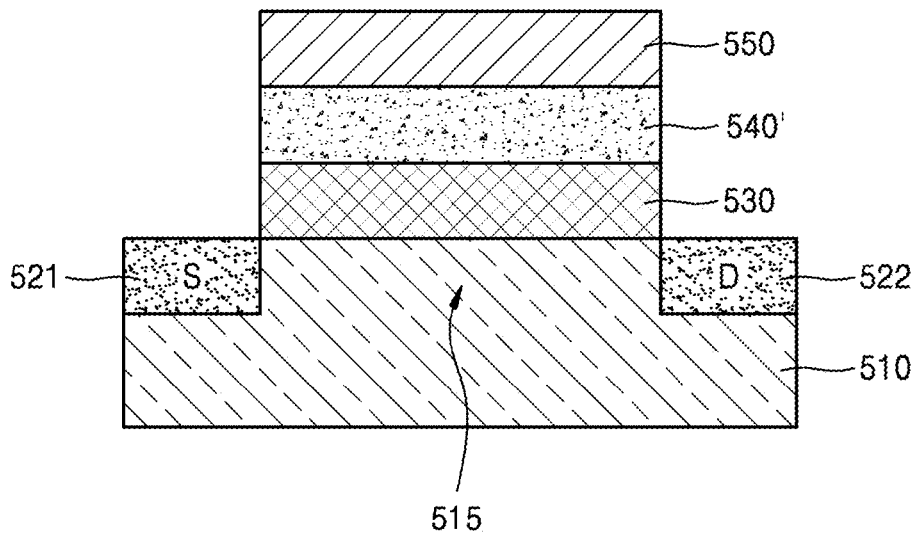

Referring to FIG. 7D, the gate electrode 550 may be formed on an upper surface of the amorphous dielectric material layer 540'. The gate electrode 550 may be formed by depositing conductive metal on the upper surface of the amorphous dielectric material layer 540' by using, for example, CVD, ALD, or physical vapor deposition (PVD).

Figure 7E:
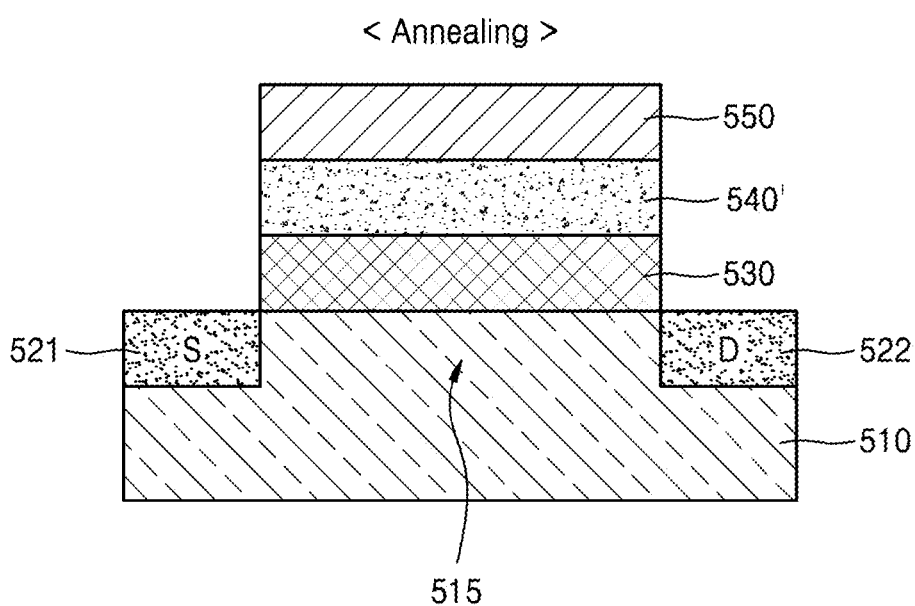
Figure 7F:
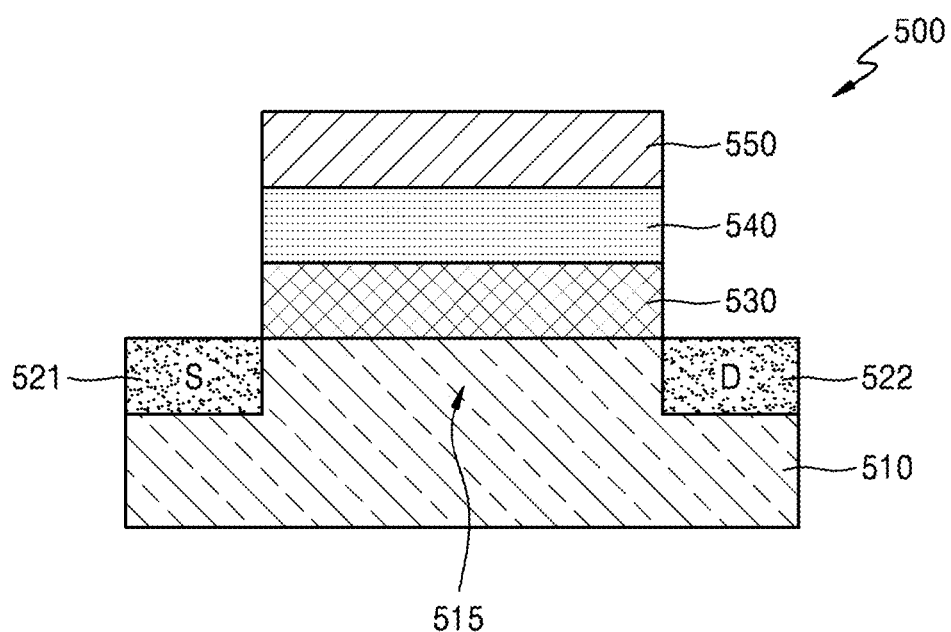

Referring to FIG. 7E, the annealing process may be performed to form the ferroelectric crystallization layer 540 by crystallizing the amorphous dielectric material layer 540'. The annealing process may be performed, for example, at a temperature of about 400° C. to about 1000° C. Also, the period of the annealing process may be within about one minute. However, it is not limited thereto, and the temperature and the period of the annealing process may vary. At least a portion of the amorphous dielectric material layer 540' may be crystallized through this annealing process to form the ferroelectric crystallization layer 540 as illustrated in FIG. 7F and the electronic device 500 may be manufactured.

The crystallization prevention layer 530 may limit and/or prevent the effect of the crystallization of the amorphous dielectric material layer 540' through the annealing process from being spread toward the channel element 515. In detail, the crystallization of the amorphous dielectric material layer 540' through the annealing process may be started from an area contacting the gate electrode 550 and proceed downwardly to form a polycrystalline dielectric material. Also, as the crystallization process is completed, the ferroelectric crystallization layer 540 including the polycrystalline dielectric material may be formed.

The crystallization prevention layer 530 may maintain an amorphous state while the annealing process is performed, and thus, may limit and/or prevent a bonding orbital formed in the ferroelectric crystallization layer 540 from being spread toward the channel element 515 of the substrate 510. Like this, the crystallization prevention layer 530 may be provided between the amorphous dielectric material layer 540' and the channel element 515 to limit and/or prevent the effect of the crystallization of the amorphous dielectric material layer 540' from being spread toward the channel element 515.

The ferroelectric crystallization layer 540 formed by crystallizing the amorphous dielectric material layer 540' may include a dielectric material having ferroelectricity or anti-ferroelectricity. The ferroelectric crystallization layer 440 may include a crystalline dielectric material having a dielectric constant that is, for example, greater than about 20. However, it is not limited thereto.

For example, the ferroelectric crystallization layer 540 may include oxide including at least one of Si, Al, Hf, and Zr. As a detailed example, the ferroelectric crystallization layer 540 may include at least one of Hf-based oxide and Zr-based oxide. Here, the Hf-based oxide may include, for example, HfO or HfZrO and the Zr-based oxide may include, for example, ZrO. The ferroelectric crystallization layer 540 may further include a dopant, according to necessity.

The method of manufacturing the electronic device 500 described above may further include, before forming the crystallization prevention layer 530, forming a high dielectric layer (not shown) on an upper surface of the channel element 515 of the substrate 510. Here, the high dielectric layer may be formed by depositing a certain dielectric material on the upper surface of the channel element 515 by using, for example, CVD or AVD. The high dielectric layer may, together with the crystallization prevention layer 530, control the crystallization of the ferroelectric crystallization layer 540. To this end, the high dielectric layer may include a different dielectric material from the crystallization prevention layer 530. In detail, the high dielectric layer may include a high-k dielectric material having a higher dielectric constant than silicon oxide.

The high dielectric layer may include an amorphous dielectric material. Also, the high dielectric layer may include a crystalline dielectric material. In this case, the high dielectric layer may be formed by depositing an amorphous dielectric material on the upper surface of the channel element 515 and then crystallizing the amorphous dielectric material through a certain annealing process.

The method may further include, before forming the high dielectric layer described above, forming a high band gap layer (not shown) on the upper surface of the channel element 515 of the substrate 510. The high band gap layer may be formed by depositing a certain amorphous dielectric material on the upper surface of the channel element 515 by using, for example, CVD or ALD.

The high band gap layer may suppress or prevent current leakage and may also be used for capacitance matching in a gate stack structure. The high band gap layer may include an amorphous dielectric material having a greater band gap than a material of the high dielectric layer formed above the high band gap layer. For example, the high band gap layer may include at least one of Si, Al, Hf, and Zr. However, it is not limited thereto.

Figure 8A:
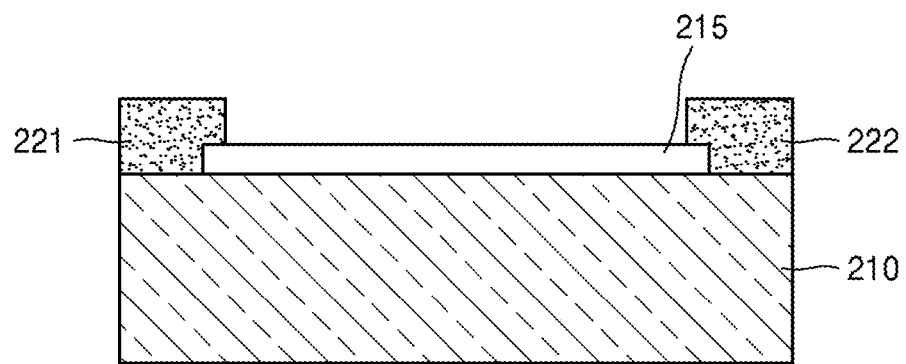
FIGS. 8A through 8C are views for describing a method of manufacturing an electronic device, according to an example embodiment.
Figure 8B:
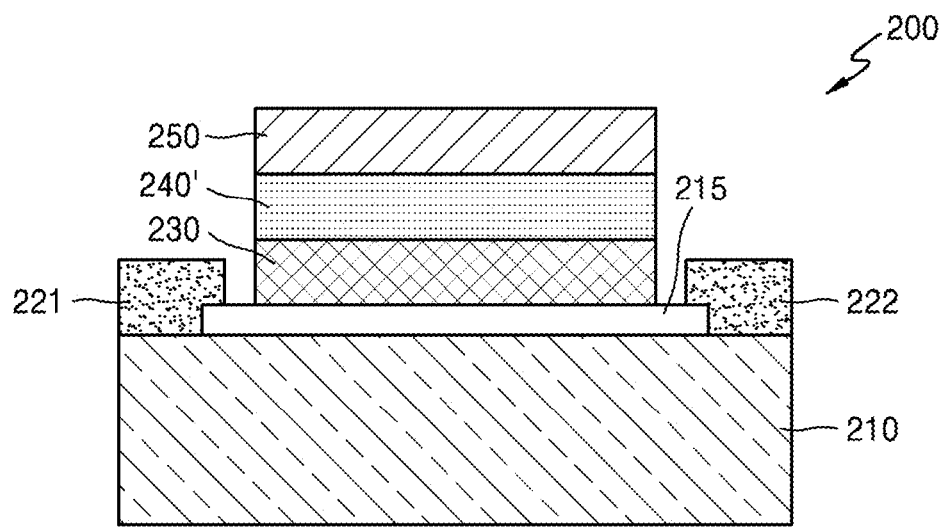
Figure 8C:
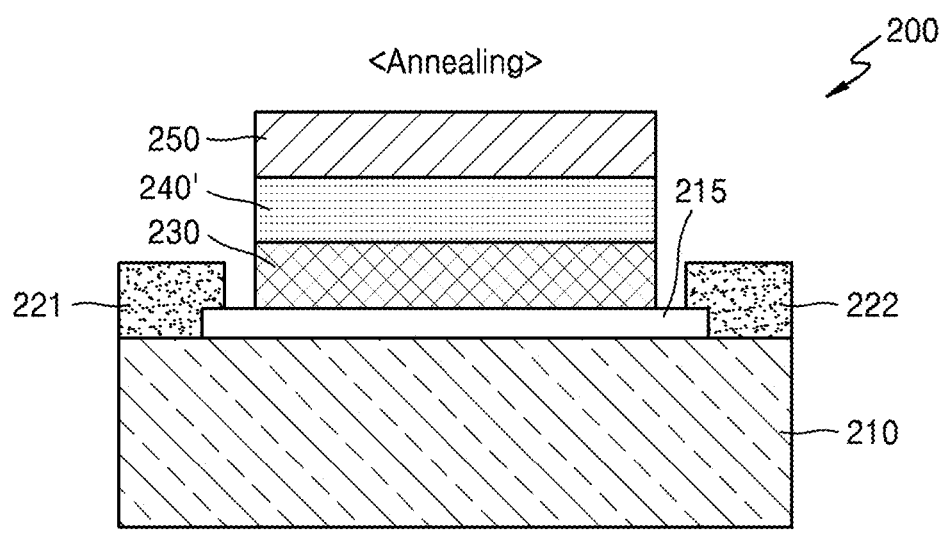

FIGS. 8A through 8C are views for describing a method of manufacturing an electronic device, according to an example embodiment.

FIGS. 8A to 8C illustrate a method of manufacturing the electronic device in FIG. 4, according to an example embodiment. In FIG. 8A, a channel film may be formed on the substrate 210 and patterned into the channel layer 215. Then a conductive layer may be formed on the channel layer 215 and patterned into the source electrode 221 and drain electrode 222. In FIG. 8B, a crystallization prevention layer 230, amorphous dielectric material layer 240', and gate electrode 250 may be sequentially formed on the channel layer 215, source electrode 221, and drain electrode 222 through deposition processes. Next, in FIG. 8C, an annealing process may convert the amorphous dielectric material layer 240' into the ferroelectric crystallization layer 240 of FIG. 4.

Figure 9A:
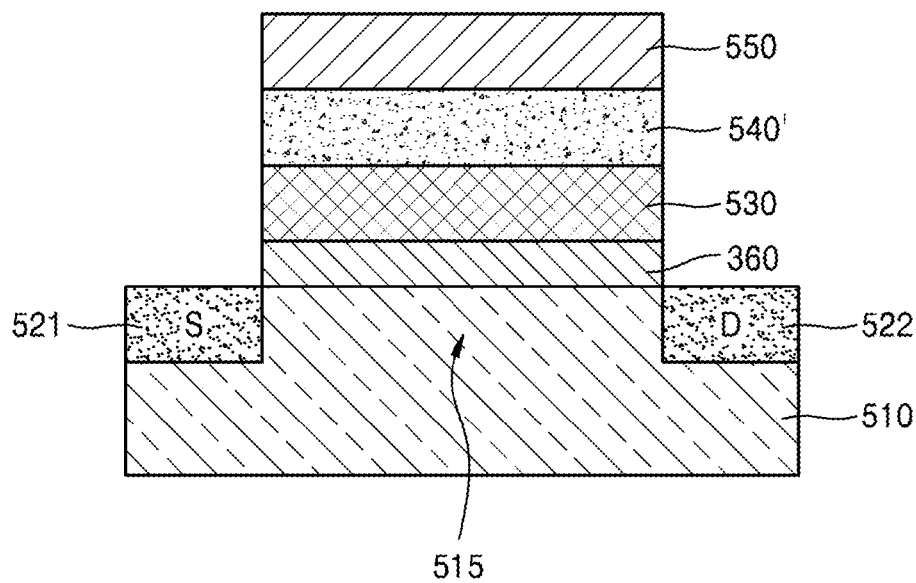
FIGS. 9A through 9B are views for describing a method of manufacturing an electronic device, according to an example embodiment.
Figure 9B:
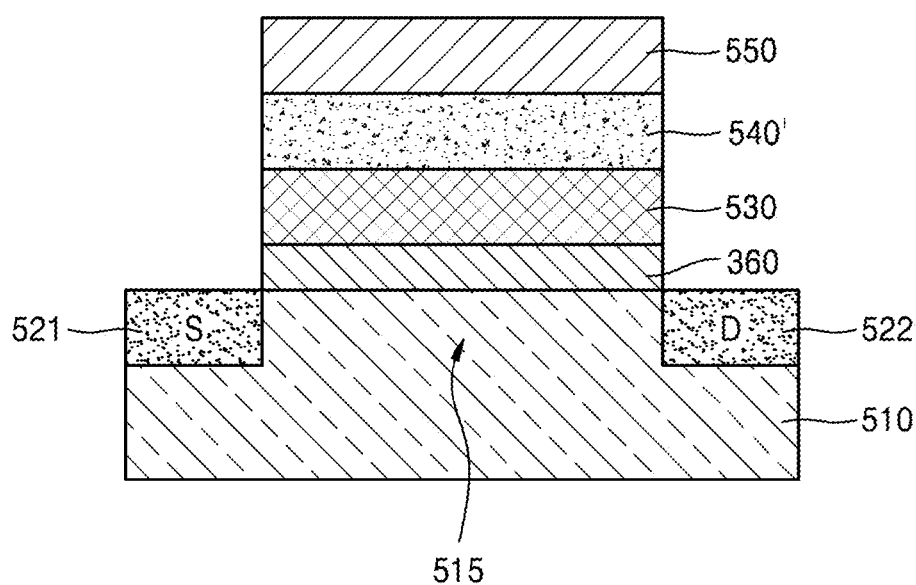

FIGS. 9A through 9B are views for describing a method of manufacturing an electronic device, according to an example embodiment, such as the electronic device in FIG. 5.

FIGS. 9A and 9B are similar to FIGS. 7A to 7D, except a high-k dielectric layer 360 may be formed on the substrate before forming the crystallization prevention layer 530 to provide a stacked structure shown in FIG. 9A. Then, in FIG. 9B, the stacked structure may be annealed. After the annealing process, the electronic device in FIG. 5 is provided.

Figure 10A:
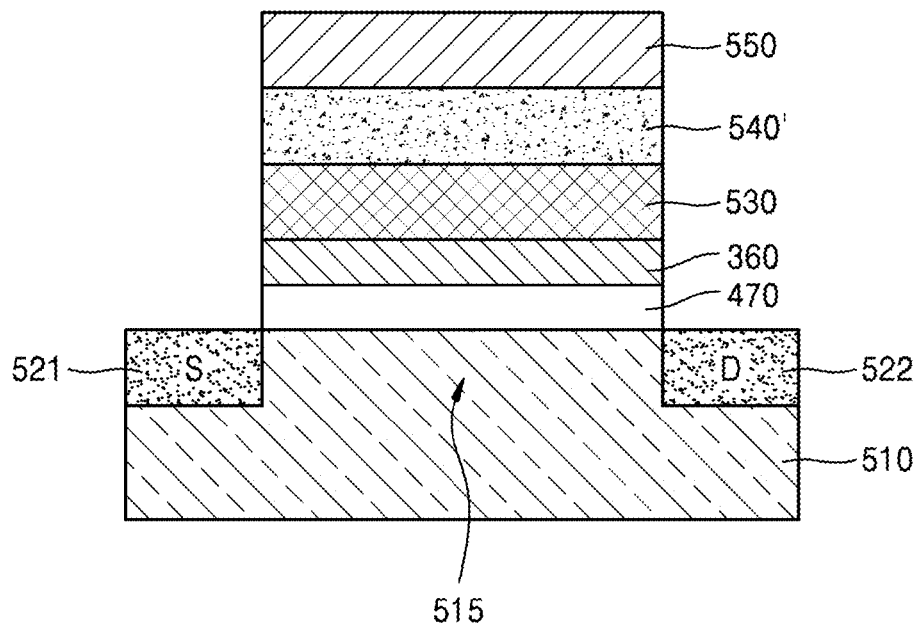
FIGS. 10A through 10B are views for describing a method of manufacturing an electronic device, according to an example embodiment.
Figure 10B:
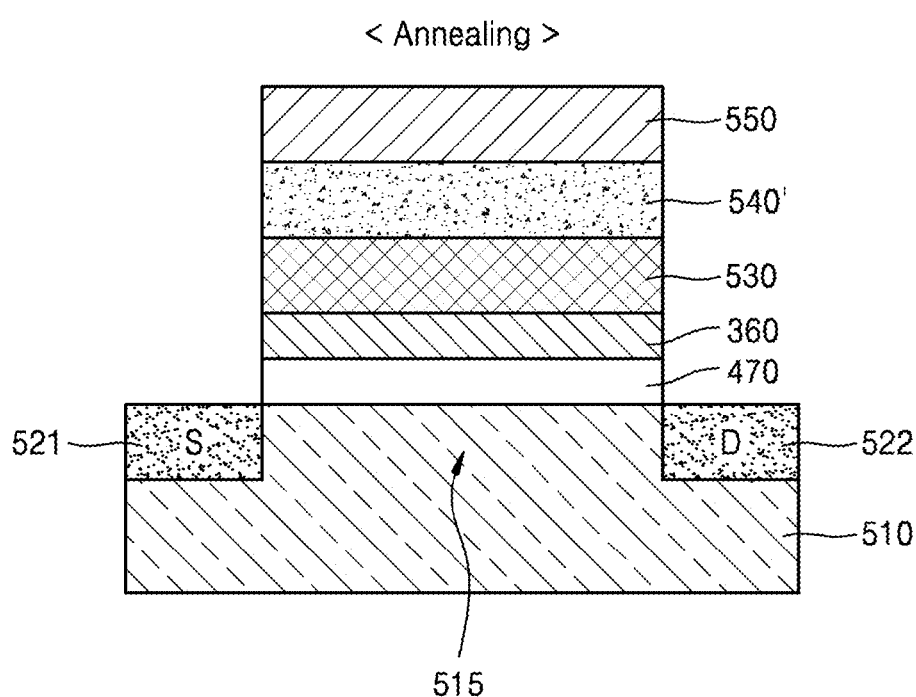

FIGS. 10A through 10B are views for describing a method of manufacturing an electronic device, according to an example embodiment, such as the electronic device in FIG. 6.

FIGS. 10A and 10B are similar to FIGS. 7A to 7D, except a high band gap layer 470 and a high-k dielectric layer 360 may be formed on the substrate before forming the crystallization prevention layer 530 to provide a stacked structure shown in FIG. 10A. Then, in FIG. 10B, the stacked structure may be annealed. After the annealing process, the electronic device in FIG. 6 may be provided.

In the electronic devices according to the example embodiments, the ferroelectric crystallization layers have ferroelectricity or anti-ferroelectricity, and thus, sub-threshold swings of the electronic devices may be decreased. Also, the crystallization prevention layers may be provided between the ferroelectric crystallization layers and the channel elements, and thus, crystallization of the ferroelectric crystallization layers via annealing processes may be limited and/or prevented from being spread toward the channel elements, so as to limit and/or prevent current leakage of the electronic devices. Like this, since the crystallization prevention layers limit and/or prevent the crystallization in the ferroelectric crystallization layers from affecting an area below the crystallization prevention layers, the ferroelectric crystallization layers may maintain the effect of ferroelectricity or anti-ferroelectricity based on the crystallization, while current leakage is limited and/or prevented. Accordingly, the performance of the electronic devices may be improved.

Also, the crystallization prevention layers and the high dielectric layers may be provided between the ferroelectric crystallization layers and the channel elements and the crystallization prevention layers and the high dielectric layers may include different materials from each other. Thus, crystallization of the ferroelectric crystallization layers may be effectively controlled. Accordingly, current leakage may be limited and/or prevented and the performance of the electronic devices may be improved. Embodiments that are described herein are only examples and various modifications may be made from these embodiments by one of ordinary skill in the art.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An electronic device comprising:
   a substrate;
   a gate electrode on the substrate;
   a ferroelectric crystallization layer between the gate electrode and the substrate, the ferroelectric crystallization layer being at least partially crystallized and including a dielectric material having ferroelectricity or anti-ferroelectricity; and
   a dielectric layer between the ferroelectric crystallization layer and the substrate, the dielectric layer including an amorphous dielectric material.

2. The electronic device of claim 1, wherein the ferroelectric crystallization layer includes a crystalline dielectric material having a dielectric constant that is greater than about 20.

3. The electronic device of claim 2, wherein the ferroelectric crystallization layer includes an oxide that includes at least one of Si, Al, Hf, and Zr.

4. The electronic device of claim 1, wherein the dielectric layer includes a first dielectric layer including a different dielectric material than a material of the ferroelectric crystallization layer; and a second dielectric layer between the first dielectric layer and the substrate, the second dielectric layer including the amorphous dielectric material.

5. The electronic device of claim 4, wherein the first dielectric layer has a dielectric constant that is greater than about 4.

6. The electronic device of claim 5, wherein the first dielectric layer includes at least one of AlOx (0<x<1), LaOx (0<x<1), YOx (0<x<1), LaAlOx (0<x<1), TaOx (0<x<1), TiOx (0<x<1), SrTiOx (0<x<1), CaO, MgO, ZrSiO, and a 2D dielectric material.

7. The electronic device of claim 4, wherein the second dielectric layer has a higher dielectric constant than silicon oxide and includes a different dielectric material than a material of the first dielectric layer.

8. The electronic device of claim 4, further comprising:
   a high band gap layer between the second dielectric layer and the substrate, wherein
   the high band gap layer includes an amorphous dielectric material having a greater band gap than a material of the second dielectric layer.

9. The electronic device of claim 1, wherein
   the substrate includes a channel element at a location corresponding to the gate electrode, and
   the substrate includes a source and a drain at both sides of the channel element.

10. The electronic device of claim 9, wherein
    the channel element includes at least one of Si, Ge, SiGe, Groups III-V semiconductors, an oxide semiconductor, a nitride semiconductor, an oxynitride semiconductor, a two-dimensional (2D) semiconductor material, quantum dots, and an organic semiconductor.

11. An electronic device comprising:
    a channel element including an intermediate region between a first side and a second side;
    a gate electrode on the intermediate region of the channel element;
    a ferroelectric crystallization layer between the gate electrode and the channel element, the ferroelectric crystallization layer being at least partially crystallized and including a dielectric material having ferroelectricity or anti-ferroelectricity; and
    a dielectric layer between the ferroelectric crystallization layer and the channel element, the dielectric layer including an amorphous dielectric material.

12. The electronic device of claim 11, wherein the ferroelectric crystallization layer includes a crystalline dielectric material having a dielectric constant that is greater than about 20.

13. The electronic device of claim 12, wherein the ferroelectric crystallization layer includes an oxide that includes at least one of Si, Al, Hf, and Zr.

14. The electronic device of claim 11, wherein the dielectric layer includes a first dielectric layer including a different dielectric material than a material of the ferroelectric crystallization layer; and a second dielectric layer between the first dielectric layer and the channel element, the second dielectric layer including the amorphous dielectric material.

15. The electronic device of claim 14, wherein the first dielectric layer has a dielectric constant that is greater than about 4.

16. The electronic device of claim 14, wherein the second dielectric layer has a higher dielectric constant than silicon oxide and includes a different dielectric material than a material of the first dielectric layer.

17. The electronic device of claim 14, further comprising:
    a high band gap layer between the second dielectric layer and the channel element, wherein
    the high band gap layer includes an amorphous dielectric material having a greater band gap than a material of the second dielectric layer.

18. The electronic device of claim 11, further comprising:
    a substrate, wherein
    the channel element is a portion of the substrate, and
    the substrate is a semiconductor substrate.

19. The electronic device of claim 11, further comprising:
    a substrate, wherein
    the channel element is a channel layer on the substrate, and
    the channel layer includes at least one of an oxide semiconductor, a nitride semiconductor, an oxynitride semiconductor, quantum dots, and an organic semiconductor.

20. The electronic device of claim 11, further comprising:
    a source connected to the first side of the channel element; and
    a drain connected to the second side of the channel element.

* * * * *